United States Patent
Pal et al.

(10) Patent No.: US 10,498,116 B2
(45) Date of Patent: Dec. 3, 2019

(54) THREE-DIMENSIONAL POWER DISTRIBUTION INTERCONNECT STRUCTURE

(71) Applicant: Hamilton Sundstrand Corporation, Charlotte, NC (US)

(72) Inventors: Debabrata Pal, Hoffman Estates, IL (US); Michael Krenz, Roscoe, IL (US); John Horowy, Rockford, IL (US); Eric Karlen, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 199 days.

(21) Appl. No.: 15/813,696

(22) Filed: Nov. 15, 2017

(65) Prior Publication Data

US 2018/0083425 A1    Mar. 22, 2018

Related U.S. Application Data

(62) Division of application No. 14/295,427, filed on Jun. 4, 2014, now Pat. No. 9,825,437.

(51) Int. Cl.
| | |
|---|---|
| *H02B 1/56* | (2006.01) |
| *H02B 1/20* | (2006.01) |
| *H02B 1/015* | (2006.01) |
| *B60R 16/02* | (2006.01) |
| *H05K 7/20* | (2006.01) |

(52) U.S. Cl.
CPC .............. *H02B 1/56* (2013.01); *B60R 16/02* (2013.01); *H02B 1/015* (2013.01); *H02B 1/20* (2013.01); *H05K 7/2089* (2013.01)

(58) Field of Classification Search
CPC .......... H02B 1/56; H05K 1/0203; H02M 1/00; H02M 11/00
See application file for complete search history.

(56) References Cited

U.S. PATENT DOCUMENTS

| | | |
|---|---|---|
| 4,716,498 A | 12/1987 | Ellis |
| 6,018,455 A | 6/2000 | Wilkie, II et al. |
| 6,278,179 B1 | 8/2001 | Mermet-Guyennet |
| 6,574,094 B1 | 6/2003 | Morrow |
| 7,646,590 B1 | 1/2010 | Corhodzic et al. |

(Continued)

FOREIGN PATENT DOCUMENTS

| | | |
|---|---|---|
| DE | 9109911 U1 | 12/1992 |
| WO | 0002430 A1 | 1/2000 |

OTHER PUBLICATIONS

EP Search report, EP Application No. 15169555.8; dated Oct. 5, 2015; 5 pages.

*Primary Examiner* — Austin Murata
(74) *Attorney, Agent, or Firm* — Cantor Colburn LLP

(57) ABSTRACT

An electrical power distribution system for a mobile platform, and a method for making such, includes a forming a substrate having a first panel connected to a second panel. The first panel resides in a first plane that differs from a second plan in which the second panel resides. One or more bus bars are arranged on the first panel, with one or more power electronic devices arranged on the first panel and connected to the one or more bus bars. One or more connectors are arranged on the second panel and electrically connected to the one or more bus bars. Finally, one or more thermal relief devices are arranged in contact with the substrate.

5 Claims, 6 Drawing Sheets

(56) References Cited

U.S. PATENT DOCUMENTS

| | | |
|---|---|---|
| 7,837,496 B1 | 11/2010 | Pal |
| 8,184,450 B1 | 5/2012 | Goergen |
| 8,654,541 B2 | 2/2014 | Robert et al. |
| 8,767,399 B2 | 7/2014 | Goto |
| 2001/0017766 A1 | 8/2001 | Murowaki et al. |
| 2007/0104926 A1* | 5/2007 | Goebl .................. H01L 25/162 |
| | | 428/192 |
| 2008/0259555 A1 | 10/2008 | Bechtolsheim |
| 2009/0231810 A1 | 9/2009 | Liang et al. |
| 2010/0118458 A1 | 5/2010 | Coffey |
| 2012/0080165 A1 | 4/2012 | Pal |
| 2014/0160636 A1 | 6/2014 | Rajvanshi et al. |
| 2015/0357800 A1 | 12/2015 | Pal et al. |

* cited by examiner

THREE-DIMENSIONAL POWER DISTRIBUTION INTERCONNECT STRUCTURE

CROSS-REFERENCE TO RELATED APPLICATIONS

This application claims the benefit of U.S. application Ser. No. 14/295,427 filed Jun. 4, 2014, which is incorporated herein by reference in its entirety.

BACKGROUND

The present disclosure relates generally to power electronics systems and, more particularly, to electrical power distribution systems and methods for independent electrical systems, such as used on aircraft and other vehicles.

Electrical power distribution on mobile platforms, including aircraft and other vehicles, is accomplished by an electrical power distribution system that controls power output and signal to primary and auxiliary systems on the platform. The electrical power distribution system typically includes control circuitry provided on a printed circuit board (PCB). Power electronics devices, such as power diodes, power metal-oxide-semiconductor field-effect transistors (MOSFETs), insulated-gate bipolar transistors (IGBTs), and the like, may be connected to the PCB by ribbon bond connections or other connection devices.

Electrical power distribution systems for mobile platforms are designed to reside in a minimal amount of space. Power electronics devices, however, generate significant amounts of heat, particularly where high-current loads are present, enough to cause components of the system to fail if the heat is not sufficiently removed. Accordingly, the reduction in system size is constrained by the ability to remove the heat generated by the system. Power electronics devices are sometimes mounted on an insulated substrate to aid in thermal management. This arrangement is usually planar, i.e., a two-dimensional arrangement, with each power electronics device of the package positioned on the same surface of the insulated metalized substrate. This design requires a large amount of space, and often requires extra components, such as the control printed circuit board and wire bond or ribbon bond connections.

Accordingly, a need exists for an improved electrical power distribution system that reduces the amount of space required and adequately removes heat from power electronics devices.

BRIEF DESCRIPTION

Disclosed herein is an electrical power distribution system for a mobile platform including a substrate having a first panel connected to a second panel. The first panel resides in a first plane that differs from a second plan in which the second panel resides. One or more bus bars are arranged on the first panel, with one or more power electronic devices arranged on the first panel and connected to the one or more bus bars. One or more connectors are arranged on the second panel and electrically connected to the one or more bus bars. Finally, one or more thermal relief devices are arranged in contact with the substrate.

Another aspect of the disclosure provides a method of making an electrical power distribution system for a mobile platform that includes forming a substrate to include a first panel and a second panel, the first panel residing in a first plane and the second panel residing in a second plane that differs from the first plane. An electrically insulating layer is disposed on the first panel. A control circuit including one or more bus bars is arranged on the electrically insulating layer. One or more connectors are arranged on the second panel. One or more power electronics devices is disposed on the one or more bus bars. Finally, one or more thermal relief devices are arranged in contact with the substrate.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures. It is to be understood that other embodiments may be utilized and changes may be made without departing from the scope of the present disclosure. In particular, the disclosure provides various examples related to electrical power distribution systems on aircraft, whereas the advantages of the present disclosure as applied in a related field would be apparent to one having ordinary skill in the art and are considered to be within the scope of the present invention.

Figure 1:
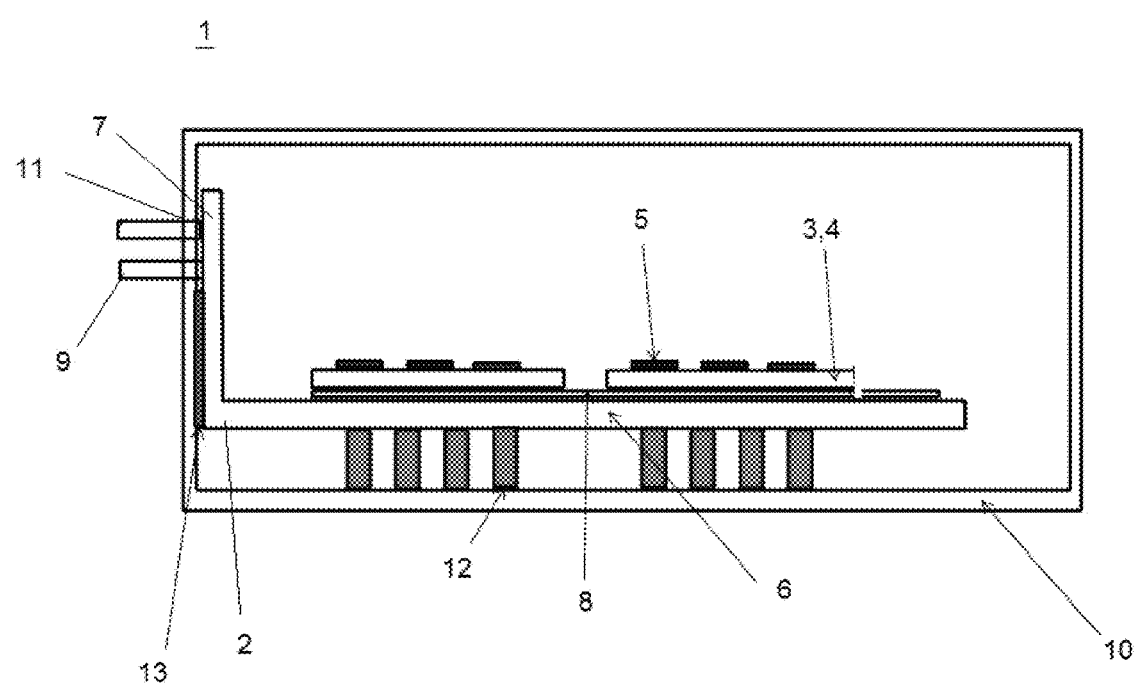
FIG. 1 is a sectioned side view of an electrical power distribution system for a mobile platform according to one embodiment.
Figure 2A:
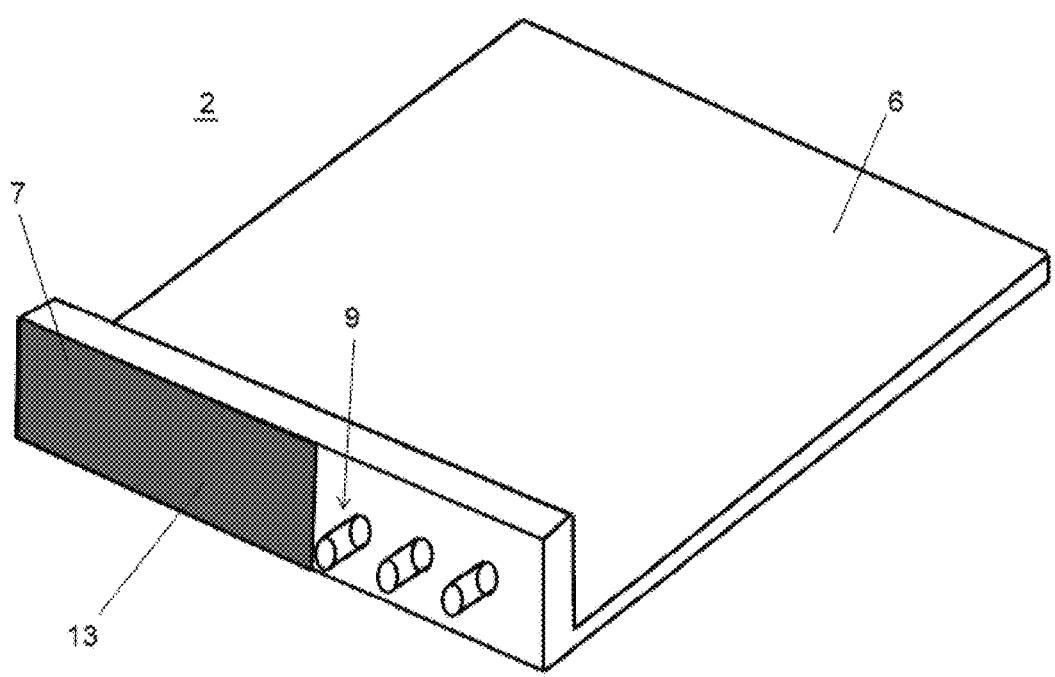
FIGS. 2A and 2B are plan and side views, respectively, of a substrate for an electrical power distribution system according to another embodiment.
Figure 2B:
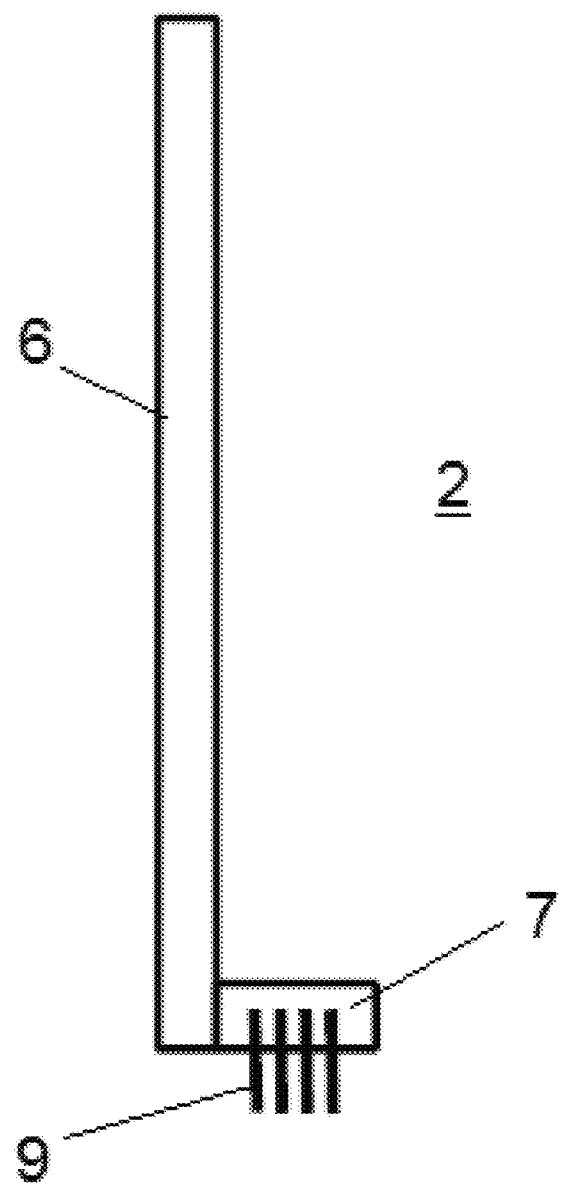

FIGS. 1, 2A, and 2B illustrate various embodiments of an electrical power distribution system 1 that includes a substrate 2 on which resides a control circuit 3, including one or more bus bars 4, and one or more power electronics devices 5. The substrate 2 comprises a first panel 6 and a second panel 7 that are joined and that reside in different, non-parallel planes. The one or more power electronics devices 5 are arranged on the bus bars 4 of the control circuit 3. The bus bars 4, in turn, are disposed on an insulating layer 8 that is formed on a surface of the first panel 6 of the substrate 2. The control circuit 3 is also electrically connected to one or more connectors 9 disposed on the second panel 7 of the substrate 2. The substrate 2 is contained within a housing 10, which includes one or more openings 11 through which the connectors 9 extend.

The system 1 also includes one or more thermal relief devices, such as a thermal conduction device 12 and a thermal interface 13. The thermal conduction device 12 is arranged between the first panel 6 of the substrate 2 and the housing 10. The thermal interface 13 is arranged between the second panel 7 of the substrate 2 and the housing 10.

The substrate 2 is a three-dimensional structure, i.e., non-planar, having multiple facets. In the embodiment illustrated in FIGS. 1, 2A, and 2B, the substrate 2 comprises a first panel 6 and a second panel 7 that form intersecting, non-parallel planes. The first panel 6 and the second panel 7 are perpendicular, or substantially perpendicular. In other examples, the substrate 2 may be formed in a wide variety of configurations, including a variety of angles and curvatures. Further, the substrate 2 may comprise a plurality of panels of different orientations, such as a substrate having three panels arranged orthogonally. The substrate 2 may be manufactured by additive manufacturing, such as ultrasonic additive manufacturing.

The panels of the substrate 2 are configured to allow the control circuit 3 and the power electronics devices 5 to reside on the same substrate. In some examples, the connectors 9 are arranged on one or more panels on which the power electronics devices 5 are not present. In some examples, this arrangement reduces the amount of wiring or ribbon connections, allowing additional space for accomplishing thermal management.

In some examples, the substrate 2 is formed from a material with good heat conduction properties. For example, the substrate 2 may be formed from Aluminum Silicon Carbide (AlSiC), a variant thereof, or one of the many materials commonly used as substrates in the field of power electronics.

Referring again to FIG. 1, the insulating layer 8 is an electrically insulating layer disposed on the first panel 6 of the substrate 2. In one example, the insulating layer 8 comprises aluminum oxide ($Al_2O_3$), but may comprise any number of other electrically insulating materials, as will be apparent to those in the field. In some examples, the insulating layer 8 may be omitted, such as where the material of the substrate 2 is electrically insulating, with the bus bars 4 being disposed directly onto a panel of the substrate 2.

In some examples, the control circuit 3, including the bus bars 4, is formed on the insulating layer 8 by an additive manufacturing method. The bus bars 4 may be formed, for example, as a cold-sprayed copper deposit. A wiring pattern of the control circuit 3 and/or bus bar fingers may also be formed by cold-spraying a pattern of copper or another conductor onto the insulating layer 8.

The power electronics devices 5 are located on one or more panels of the substrate 2. In the embodiment illustrated by FIG. 1, the power electronics devices 5 are attached to the bus bars 4 on the insulating layer 8. The power electronics devices 5 may comprise power diodes, power metal-oxide-semiconductor field-effect transistors (MOSFETs), insulated-gate bipolar transistors (IGBTs), or the like, as may be appropriate or required for a particular application.

The electrical power distribution system 1 illustrated in FIG. 1 includes a housing 10 that contains the substrate 2, the power electronics devices 5, and other components. The housing 10 provides environmental protection to the system 1. The one or more connectors 9 extend through the openings 11 of the housing 10, and are configured to receive and/or distribute electrical power to various primary and auxiliary systems on the platform. The connectors 9 may be pins or other terminal devices that permit a reliable connection to an electrical unit 14. In some examples, the connectors 9 are arranged to minimize the amount of wiring required to reach the primary and auxiliary systems. In an alternative embodiment, the connectors 9 may comprise terminals that reside within the housing 10 but which can be accessed through the openings. In another example, the connectors 9 are formed integral to the housing 10.

Figure 3:
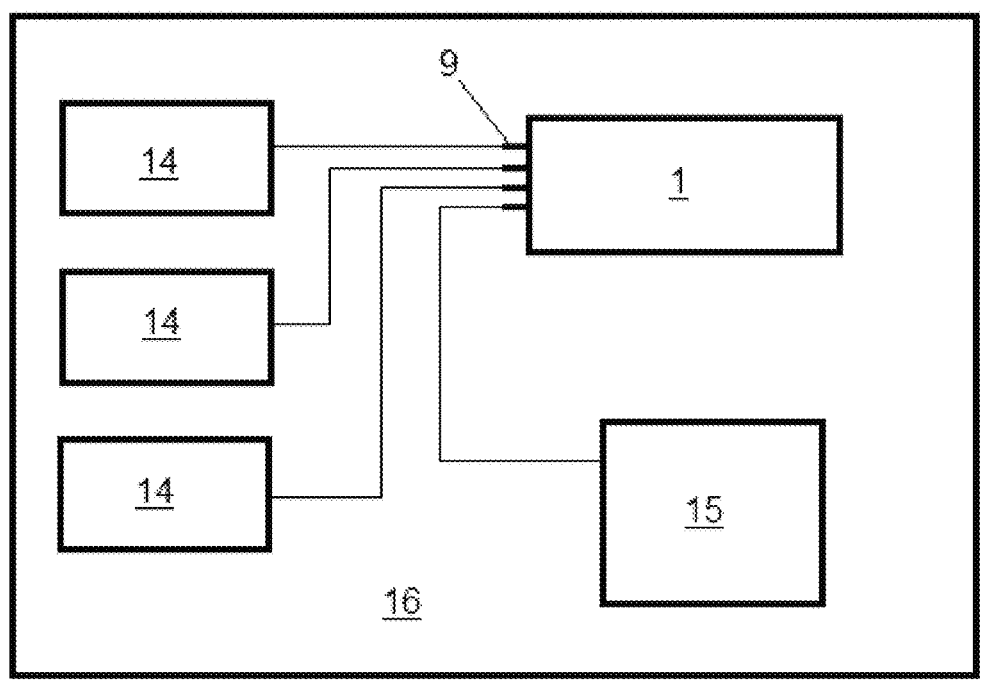
FIG. 3 is a schematic of an electrical power distribution system for a mobile platform according to another embodiment.

Referring to FIG. 3, the connectors 9 may be configured to receive electrical power from a power source 15, such as a generator, and/or distribute electrical power to one or more electrical unit 14 on a platform 16. For example, the electrical unit 14 may be the primary and auxiliary systems of an aircraft or other vehicle.

Referring again to FIG. 1, the system 1 includes one or more thermal relief devices, such as the thermal conduction device 12 and the thermal interface 13. The thermal relief devices are configured to draw heat away from the power electronics devices 5 and the substrate 2 and conduct that heat to the housing 10 or another destination. Accordingly, the thermal relief devices are constructed of a material with good heat conduction properties. In FIG. 1, the thermal conduction device 12 is arranged between the first panel 6 and the housing 10, opposite the power electronics devices 5. Other configurations are also within the scope of this disclosure. The thermal conduction device 12 may comprise thermal via columns, bars, fins, a fluid cooled device, or another device or geometrical arrangement that may be used to direct heat away from the substrate 2. The thermal interface 13 is arranged between the second panel 7 of the substrate 2 and the housing 10, at or near where the substrate 2 is attached to the housing 10. The thermal interface 13 comprises a thermally conductive layer or plate that contacts both the housing 10 and the substrate 2. The housing 10 can serve as a heat sink or may be connected to other structures that comprise a heat sink. For example, the housing 10 may be actively cooled, (by water, air, coolant, etc.), or connected to another structure that is actively cooled.

The electrical power distribution system 1 for a mobile platform such as an aircraft is constructed with minimal area and a relatively dense arrangement of power electronics devices 5. This is accomplished, in part, by the non-planar substrate 2 that enables an efficient arrangement of connectors 9 and thermal relief devices.

Figure 4:
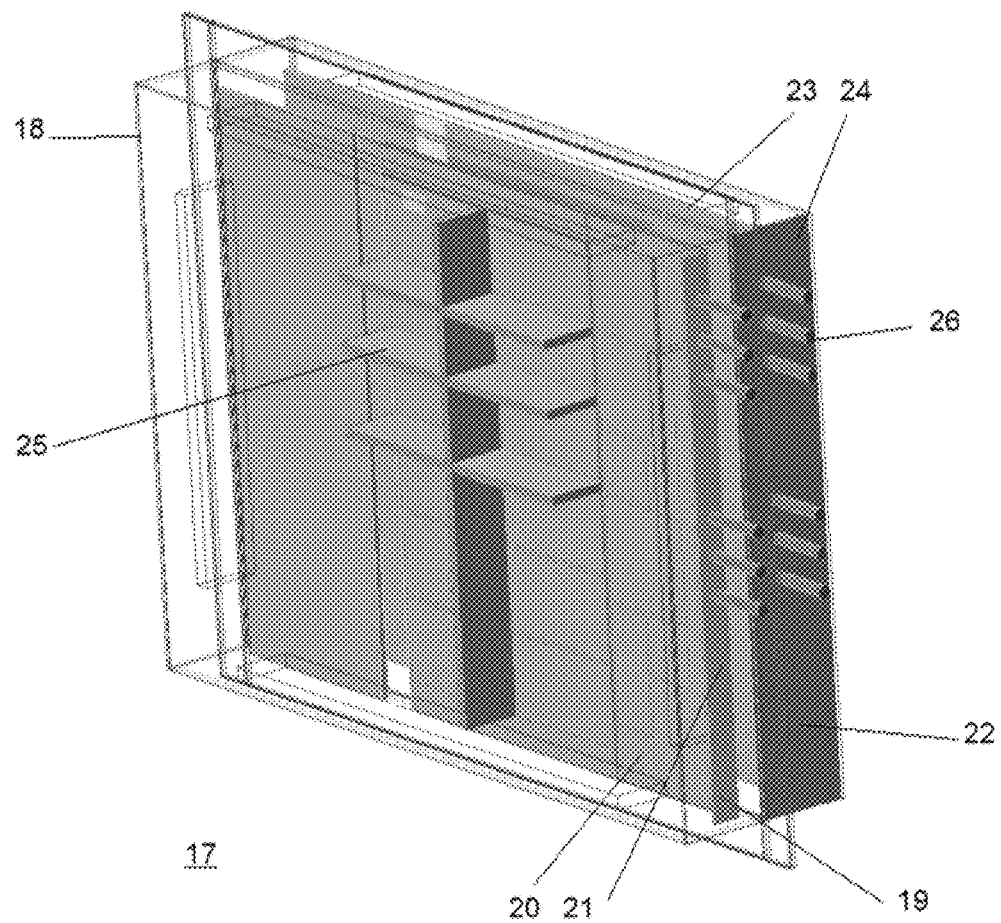
FIG. 4 is a partially sectioned plan view of an electrical power distribution system for a mobile platform according to another embodiment.
Figure 5:
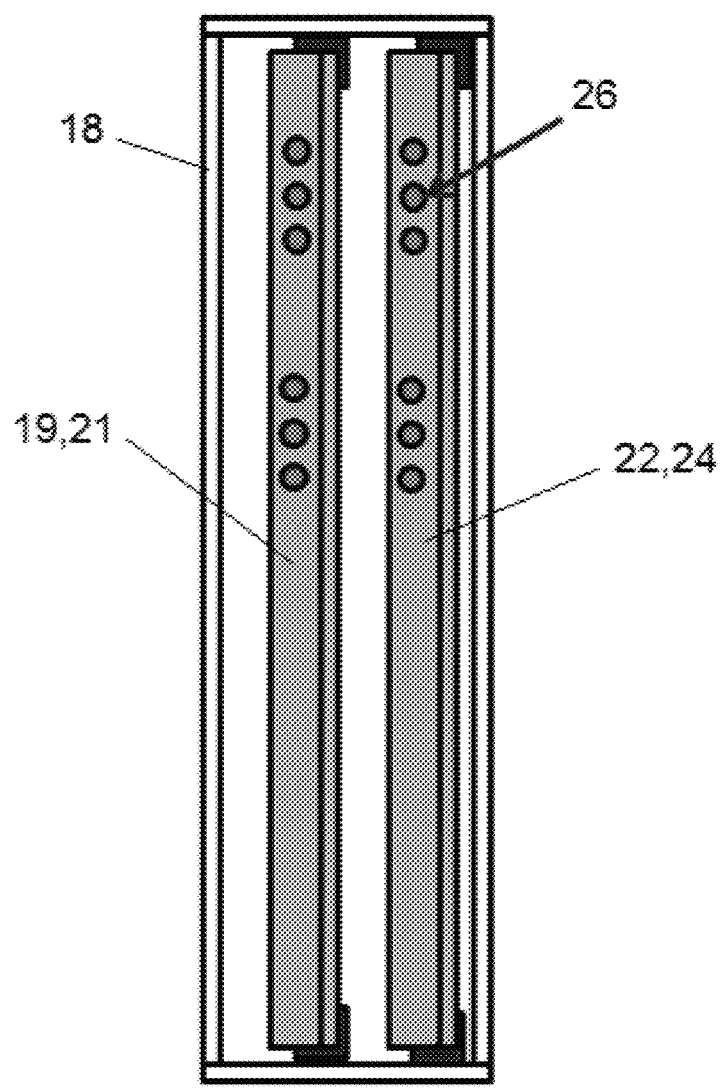
FIG. 5 is a front view of the electrical power distribution system shown in FIG. 4.

FIGS. 4 and 5 illustrate another embodiment of an electrical power distribution system 17 includes two or more substrates within a protective housing 18. The system 17 comprises a first substrate 19, having a first substrate first panel 20 and a first substrate second panel 21, and a second substrate 22, having a second substrate first panel 23 and a second substrate second panel 24. FIG. 4, shows a first thermal conduction device 25 arranged adjacent to the first substrate first panel 20, the first thermal conduction device 25 comprising an plurality of interconnected thermal bars. A second thermal conduction device (not shown) is arranged adjacent to the second substrate first panel 23. A plurality of pin connectors 26 extends from each of the first substrate second panel 21 and the second substrate second panel 24. As will be appreciated by those in the art, additional configurations of a system 17 having multiple substrates are possible and are within the scope of this disclosure.

A method for making the electrical distribution system 1 described above includes forming a non-planar substrate having a plurality of panels. The substrate may be formed by a number of manufacturing methods, including ultrasonic additive manufacturing and other additive manufacturing methods. The use of additive manufacturing methods reduces the amount of waste in production and, further, may allow the formation of an integrated structure into shapes that would be infeasible using subtractive manufacturing methods. In some examples, an insulating layer is formed on one or more surfaces of one or more panels of the substrate.

A control circuit, including one or more bus bars, is disposed on the insulating layer of one or more panels, (or directly onto the substrate). The control circuit may be printed or deposited using any number of methods, including cold spray and other additive techniques. One or more power electronics devices are arranged on, or connected to, the control circuit. The power electronics devices may be attached by any one of a number of methods known in the art. In some examples, the power electronics devices are disposed on one or more bus bars by using a low temperature transient liquid phase sintering (LT-TLPS) process, which provides an attachment that is reliable at high temperatures.

Thermal relief devices, such as thermal conduction devices and thermal interfaces, as described herein, are then arranged adjacent to one or more panels of the substrate. The thermal relief devices and the substrate may be further arranged within a housing, with one or more connectors arranged to extend through one or more walls of the housing, or arranged to be accessed through one or more walls of the housing.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc., do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A method of making an electrical power distribution system for a mobile platform, comprising:
    forming a substrate comprising a first panel and a second panel, the first panel residing in a first plane and the second panel residing in a second plane that differs from the first plane;
    disposing an electrically insulating layer on the first panel;
    arranging a control circuit on the electrically insulating layer including one or more bus bars;
    arranging one or more connectors on the second panel of the substrate;
    disposing one or more power electronics devices on the one or more bus bars; and
    arranging one or more thermal relief devices in contact with the substrate.

2. The method of claim 1, further comprising arranging the substrate in a housing, the second panel being attached to a wall of the housing, the one or more connectors extending through the wall of the housing.

3. The method of claim 1, wherein the step of forming the substrate is performed by an additive process.

4. The method of claim 1, wherein the step of disposing the one or more power electronics devices is performed via low temperature transient liquid phase sintering.

5. The method of claim 1, wherein the step of arranging the control circuit comprises depositing a wiring pattern and the bus bars via cold spray.

* * * * *